(12) United States Patent
Cantell et al.

(10) Patent No.: US 8,846,481 B2
(45) Date of Patent: Sep. 30, 2014

(54) TRANSISTOR AND METHOD OF FORMING THE TRANSISTOR SO AS TO HAVE REDUCED BASE RESISTANCE

(71) Applicant: International Business Machines Corporation, Armonk, NY (US)

(72) Inventors: Marc W. Cantell, Sheldon, VT (US); Thai Doan, Burlington, VT (US); Jessica A. Levy, Milton, VT (US); Qizhi Liu, Lexington, MA (US); William J. Murphy, North Ferrisburgh, VT (US); Christa R. Willets, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/135,664

(22) Filed: Dec. 20, 2013

(65) Prior Publication Data

US 2014/0113426 A1    Apr. 24, 2014

Related U.S. Application Data

(62) Division of application No. 13/155,730, filed on Jun. 8, 2011, now abandoned.

(51) Int. Cl.
| | | |
|---|---|---|
| *H01L 21/331* | (2006.01) | |
| *H01L 29/66* | (2006.01) | |
| *H01L 29/08* | (2006.01) | |
| *H01L 21/8222* | (2006.01) | |
| *H01L 29/737* | (2006.01) | |
| *H01L 29/732* | (2006.01) | |

(52) U.S. Cl.
CPC .... *H01L 29/66234* (2013.01); *H01L 29/66272* (2013.01); *H01L 29/66242* (2013.01); *H01L 29/0817* (2013.01); *H01L 29/0804* (2013.01); *H01L 21/8222* (2013.01); *H01L 29/7378* (2013.01); *H01L 29/732* (2013.01)
USPC ........... 438/312; 438/170; 438/189; 438/235; 257/E21.35

(58) Field of Classification Search
CPC ............ H01L 21/8222; H01L 27/1022; H01L 27/2445; H01L 29/0804; H01L 29/0817; H01L 29/66234; H01L 29/6642; H01L 29/66272; H01L 29/73; H01L 2924/13051
USPC ................. 438/170, 189, 235, 312, 341, 343; 257/E21.35, E21.371, E21.608
See application file for complete search history.

(56) References Cited

U.S. PATENT DOCUMENTS

| | | | |
|---|---|---|---|
| 4,732,871 A | | 3/1988 | Buchmann et al. |
| 5,286,661 A | * | 2/1994 | de Fresart et al. ............ 438/343 |

(Continued)

OTHER PUBLICATIONS

IBM, PCT/US2012/039557, May 25, 2012, International Search Report, Aug. 31, 2012, 14 pages.

(Continued)

*Primary Examiner* — William F Kraig
*Assistant Examiner* — Joseph C Nicely
(74) *Attorney, Agent, or Firm* — Gibb & Riley, LLC; David A. Cain, Esq.

(57) ABSTRACT

Disclosed is a transistor structure, having a completely silicided extrinsic base for reduced base resistance $R_b$. Specifically, a metal silicide layer covers the extrinsic base, including the portion of the extrinsic base that extends below the upper portion of a T-shaped emitter. One exemplary technique for ensuring that the metal silicide layer covers this portion of the extrinsic base requires tapering the upper portion of the emitter. Such tapering allows a sacrificial layer below the upper portion of the emitter to be completely removed during processing, thereby exposing the extrinsic base below and allowing the metal layer required for silicidation to be deposited thereon. This metal layer can be deposited, for example, using a high pressure sputtering technique to ensure that all exposed surfaces of the extrinsic base, even those below the upper portion of the emitter, are covered.

18 Claims, 10 Drawing Sheets

(56) References Cited

U.S. PATENT DOCUMENTS

| | | | |
|---|---|---|---|
| 5,516,710 | A | 5/1996 | Boyd et al. |
| 5,717,228 | A | 2/1998 | Matsuoka et al. |
| 6,207,568 | B1 | 3/2001 | Liu et al. |
| 6,465,317 | B2 | 10/2002 | Marty |
| 6,800,881 | B2 | 10/2004 | Lippert et al. |
| 6,911,681 | B1 | 6/2005 | Geiss et al. |
| 6,965,133 | B2 | 11/2005 | Geiss et al. |
| 7,037,798 | B2 * | 5/2006 | Adam et al. .................. 438/312 |
| 7,087,940 | B2 | 8/2006 | Khater et al. |
| 7,102,205 | B2 | 9/2006 | Chidambarrao et al. |
| 7,229,874 | B2 | 6/2007 | Hussain et al. |
| 7,390,721 | B2 | 6/2008 | Geiss et al. |
| 7,425,754 | B2 | 9/2008 | Akatsu et al. |
| 7,494,887 | B1 * | 2/2009 | Hussain ........................ 438/309 |
| 7,679,105 | B2 | 3/2010 | Kim et al. |
| 7,687,887 | B1 * | 3/2010 | El-Diwany et al. ........... 257/565 |
| 7,696,034 | B2 | 4/2010 | Geiss et al. |
| 7,741,186 | B2 | 6/2010 | Chidambarrao et al. |
| 7,777,255 | B2 | 8/2010 | Rucker et al. |
| 7,829,917 | B1 | 11/2010 | Thomas |
| 7,838,375 | B1 | 11/2010 | Xu et al. |
| 8,405,186 | B2 | 3/2013 | Camillo-Castillo et al. |
| 8,610,174 | B2 * | 12/2013 | Adkisson et al. ............. 257/197 |
| 2002/0197808 | A1 | 12/2002 | Schuegraf |
| 2002/0197809 | A1 * | 12/2002 | Asai et al. ..................... 438/312 |
| 2003/0096444 | A1 | 5/2003 | Kraus |
| 2004/0188797 | A1 * | 9/2004 | Khater et al. .................. 257/510 |
| 2004/0256696 | A1 | 12/2004 | Park |
| 2005/0012180 | A1 | 1/2005 | Freeman et al. |
| 2005/0199907 | A1 | 9/2005 | Divakaruni et al. |
| 2005/0236645 | A1 * | 10/2005 | Khater et al. .................. 257/183 |
| 2005/0242373 | A1 | 11/2005 | Ahlgren et al. |
| 2006/0017066 | A1 * | 1/2006 | Geiss et al. .................... 257/197 |
| 2008/0083934 | A1 * | 4/2008 | Pagette ........................ 257/197 |
| 2008/0265282 | A1 | 10/2008 | Gluschenkov et al. |
| 2009/0283801 | A1 | 11/2009 | Pagette et al. |
| 2010/0127352 | A1 | 5/2010 | El-Diwany et al. |
| 2010/0193835 | A1 | 8/2010 | Hshieh |

OTHER PUBLICATIONS

U.S. Appl. No. 13/155,730, filed Jun. 8, 2011, Office Action Communication, Dated Jan. 30, 2013, 7 pages.

U.S. Appl. No. 13/155,730, filed Jun. 8, 2011, Office Action Communication, Dated Mar. 15, 2013, 20 pages.

U.S. Appl. No. 13/155,730, filed Jun. 8, 2011, Office Action Communication, Dated May 16, 2013, 28 pages.

U.S. Appl. No. 13/155,730, filed Jun. 8, 2011, Advisory Action Communication, Dated Jul. 8, 2013, 3 pages.

U.S. Appl. No. 13/155,730, filed Jun. 8, 2011, Office Action Communication, Dated Aug. 28, 2013, 43 pages.

U.S. Appl. No. 13/155,730, filed Jun. 8, 2011, Office Action Communication, Dated Nov. 1, 2013, 40 pages.

* cited by examiner

TRANSISTOR AND METHOD OF FORMING THE TRANSISTOR SO AS TO HAVE REDUCED BASE RESISTANCE

CROSS-REFERENCE TO RELATED APPLICATIONS

This application is a divisional of U.S. patent application Ser. No. 13/155,730, filed Jun. 8, 2011, the complete disclosure of which is incorporated herein by reference.

BACKGROUND

1. Field of the Invention

The disclosed embodiments relate to transistors and, more particularly, to a transistor structure, such as a bipolar junction transistor (BJT) or a heterojunction bipolar transistor (HBT) structure, having a silicided extrinsic base for reduced base resistance and a method of forming the transistor structure.

2. Description of the Related Art

Those skilled in the art will recognize that it is desirable in bipolar junction transistors (BJTs) and in high performance heterojunction bipolar transistors (HBTs) to have a relatively high transit frequency $f_T$ and maximum oscillation frequency $F_{max}$. $F_{max}$ is a function of $f_T$ and of parasitics, including parasitic resistances and parasitic capacitances. One exemplary parasitic resistance is base resistance $R_b$. Thus, it would be advantageous to provide a transistor structure, such as a BJT or HBT structure, with reduced base resistance $R_b$ as well as a method for forming such a transistor structure.

SUMMARY

Disclosed herein are embodiments of a transistor structure, such as a bipolar junction transistor (BJT) structure or heterojunction bipolar transistor (HBT) structure, having an extrinsic base with a top surface that is completely silicided for reduced base resistance $R_b$. Specifically, the transistor structure can incorporate a metal silicide layer that covers the top surface of the extrinsic base, including the portion of the extrinsic base that extends below the upper portion of a T-shaped emitter (i.e., including the portion of the extrinsic base that is at the extrinsic base to intrinsic base link-up region). One exemplary technique for ensuring that the metal silicide layer covers this portion of the extrinsic base requires tapering the upper portion of the emitter. Such tapering allows a sacrificial dielectric layer below the upper portion of the emitter to be completely removed during processing, thereby exposing the portion of the extrinsic base below and allowing the metal layer required for silicidation to be deposited thereon. In one embodiment, this metal layer can be deposited using a high pressure sputtering technique to ensure that all exposed surfaces of the extrinsic base, even those below the upper portion of the emitter, are covered.

More particularly, disclosed herein are embodiments of a transistor structure, such as a BJT structure or HBT structure. The transistor structure can comprise an intrinsic base, an emitter, and a dielectric spacer. The intrinsic base can be on a substrate above a collector. The emitter can be essentially T-shaped and positioned above the intrinsic base. Specifically, the emitter can have a lower portion on a first region of the intrinsic base opposite the collector and can further have an upper portion, which is wider (i.e., can have a greater diameter) than the lower portion. The dielectric spacer can be positioned laterally adjacent to the lower portion only of the emitter.

The transistor structure can further comprise an extrinsic base and a metal silicide layer. The extrinsic base can be above and immediately adjacent to a second region of the intrinsic base such that it is positioned laterally immediately adjacent to the dielectric spacer opposite the lower portion of the emitter. The metal silicide layer can cover the top surface of the extrinsic base such that it is also positioned laterally immediately adjacent to the dielectric spacer opposite the lower portion of the emitter.

As mentioned above, the upper portion of the emitter can be wider (i.e., can have greater diameter) than the lower portion (i.e., the emitter can be essentially T-shaped). Thus, in the transistor structure described above, the upper portion of the emitter can extend laterally over the dielectric spacer and further over a section of the silicide layer, which is immediately adjacent to the dielectric spacer and which is above the extrinsic base to intrinsic base link-up region. One exemplary processing technique for ensuring that the metal silicide layer covers the entire extrinsic base, including the portion of the extrinsic base below the upper portion of the emitter (i.e., including the portion of the extrinsic base at the extrinsic base to intrinsic base link-up region), and for also ensuring that the upper portion of the emitter is sufficiently large enough to receive an emitter contact requires tapering the upper portion of the emitter. Such tapering allows a sacrificial dielectric layer on the extrinsic base to be removed during processing, thereby exposing the entire top surface of the extrinsic base and allowing the metal layer required for the silicidation to be deposited thereon. Thus, in one embodiment of the transistor structure, the upper portion of the emitter has a top surface and a tapered sidewall. The tapered sidewall specifically tapers from the top surface toward the dielectric spacer such that the width (i.e., diameter) of the upper portion gradually decreases between the top surface and the interface between the upper portion and the lower portion of the emitter.

Also disclosed herein are embodiments of a method of forming a transistor structure (e.g., a BJT structure or a HBT structure), as described above. The method can comprise depositing a polysilicon layer and performing at least one etch process so as to create, from the polysilicon layer, an essentially T-shaped emitter that comprises a lower portion and an upper portion above the lower portion. Specifically, the polysilicon layer can be deposited and etched so that the lower portion of the emitter is on a first region of an intrinsic base opposite a collector and is positioned laterally adjacent to a dielectric spacer and so that the upper portion of the emitter is wider (i.e., has a greater diameter) than the lower portion and extends laterally over the dielectric spacer onto a sacrificial dielectric layer.

Next, the method can comprise selectively removing the sacrificial dielectric layer so as to expose the top surface of an extrinsic base. This extrinsic base can be above and immediately adjacent to a second region of the intrinsic base such that it is positioned laterally immediately adjacent to the dielectric spacer opposite the lower portion of the emitter.

After the sacrificial dielectric layer is removed, a metal silicide layer can be formed on the top surface of the extrinsic base such that the metal silicide layer is positioned laterally immediately adjacent to the dielectric spacer opposite the lower portion of the emitter (i.e., at the extrinsic base to intrinsic base link-up region) and, thereby such that a section of the metal silicide layer is below the upper portion of the emitter. Forming the metal silicide layer can comprise depositing a metal layer onto the extrinsic base, performing a silicidation anneal and then removing any excess metal material. It should be noted that the metal layer deposition in this case can comprise using a high pressure sputtering technique in order to ensure that the metal layer is deposited below the upper portion of the emitter.

One exemplary processing technique for ensuring that the metal silicide layer covers the entire top surface of the extrinsic base, including the portion of the extrinsic base immediately adjacent to the dielectric spacer (i.e., including the portion of the extrinsic base at the extrinsic base to intrinsic base link-up region) and for also ensuring that the upper portion of the emitter is sufficiently large enough to receive an emitter contact requires tapering the upper portion of the emitter. That is, during the etch process(es) described above, the polysilicon layer can further be etched such that the upper portion of the emitter has a tapered sidewall. Specifically, the etch process(es) can be performed so that the resulting sidewall is tapered from the top surface of the upper portion of the emitter toward the dielectric spacer and, thereby such that the width (i.e., diameter) of the upper portion of the emitter gradually decreases between the top surface and the interface between the upper portion and the lower portion of the emitter. This tapered sidewall allows the portion of the sacrificial dielectric layer below the upper portion of the emitter to be easily and completely removed and further provides less obstructed access, for metal layer deposition, to the exposed portion of the extrinsic base below the upper portion of the emitter.

BRIEF DESCRIPTION OF THE SEVERAL VIEWS OF THE DRAWINGS

The embodiments disclosed herein will be better understood from the following detailed description with reference to the drawings, which are not necessarily drawn to scale and in which.

DETAILED DESCRIPTION

The disclosed embodiments and the various features and advantageous details thereof are explained more fully with reference to the accompanying drawings and the following detailed description.

As mentioned above, it is desirable in bipolar junction transistors (BJTs) and in high performance heterojunction bipolar transistors (HBTs) to have a relatively high transit frequency $f_T$ and maximum oscillation frequency $F_{max}$. $F_{max}$ is a function of $f_T$ and of parasitics, including parasitic resistances and parasitic capacitances. One exemplary parasitic resistance is base resistance $R_b$. Thus, it would be advantageous to provide a transistor structure, such as a BJT or HBT structure, with reduced base resistance $R_b$ as well as a method for forming such a transistor structure. Oftentimes a silicide layer is formed on the extrinsic base of a BJT or HBT and the contacts to the extrinsic base land on the silicide layer. This silicide layer reduces base resistance to some extent. However, it typically does not cover the entire top surface of the extrinsic base and, particularly, does not cover the portion of the extrinsic base that is below the upper portion of the emitter and closest to the emitter opening (i.e., does not cover the portion of the extrinsic base that is at the extrinsic base to intrinsic base link-up region). Thus, it would be advantageous to provide a transistor structure, such as a BJT structure or HBT structure, with reduced base resistance $R_b$ over prior art transistor structures as well as a method for forming such a transistor structure.

In view of the foregoing, disclosed herein are embodiments of a transistor structure, such as a bipolar junction transistor (BJT) structure or heterojunction bipolar transistor (HBT) structure, having an extrinsic base with a top surface that is completely silicided for reduced base resistance $R_b$. Specifically, the transistor structure can incorporate a metal silicide layer that covers the top surface of the extrinsic base, including the portion of the extrinsic base that extends below the upper portion of a T-shaped emitter (i.e., including the portion of the extrinsic base that is at the extrinsic base to intrinsic base link-up region). One exemplary technique for ensuring that the metal silicide layer covers this portion of the extrinsic base requires tapering the upper portion of the emitter. Such tapering allows a sacrificial dielectric layer below the upper portion of the emitter to be completely removed during processing, thereby exposing the portion of the extrinsic base below and allowing the metal layer required for silicidation to be deposited thereon. In one embodiment, this metal layer can be deposited using a high pressure sputtering technique to ensure that all exposed surfaces of the extrinsic base, even those below the upper portion of the emitter, are covered.

Figure 1:
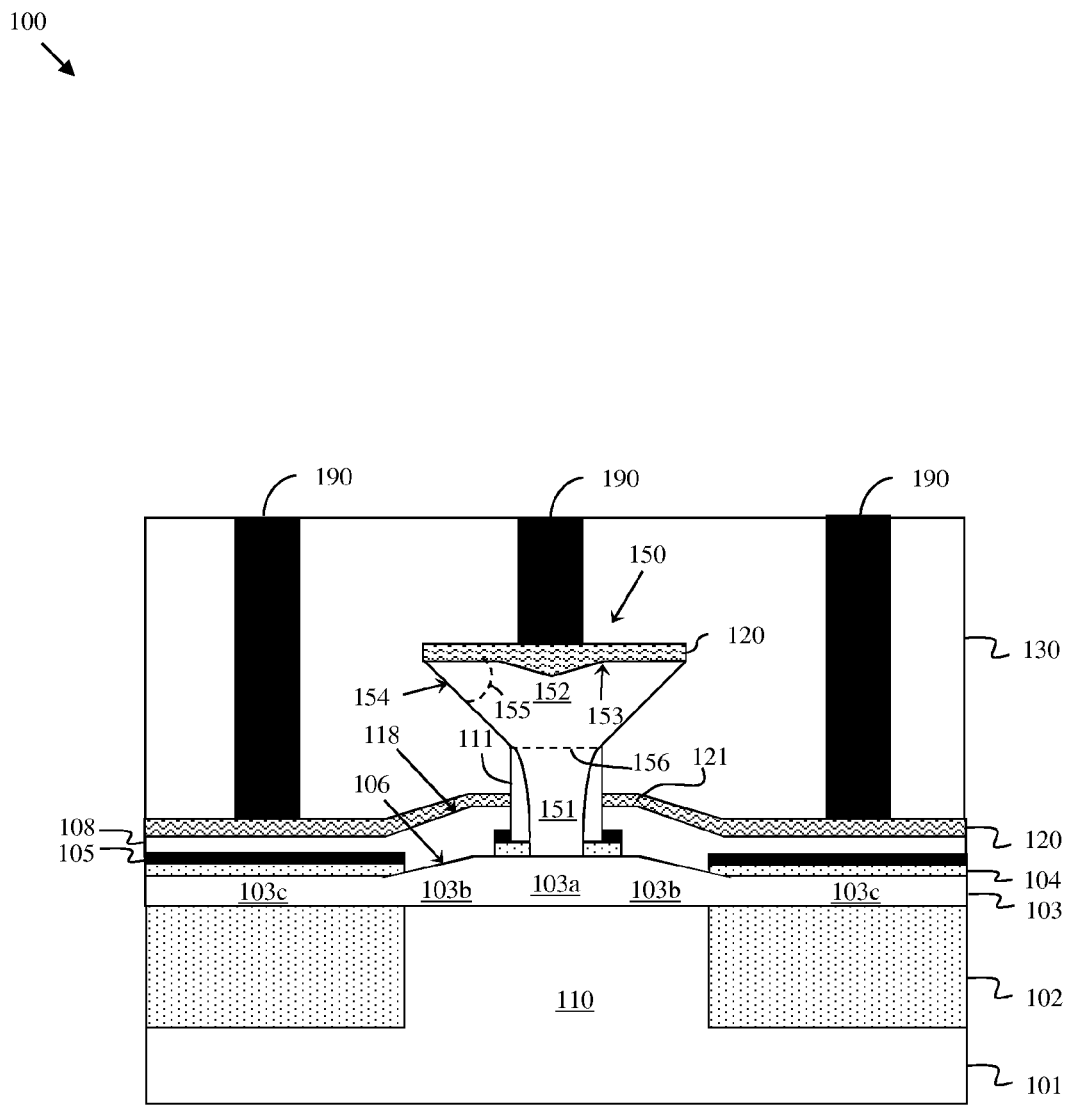
FIG. 1 is a cross-section diagram illustrating an embodiment of a transistor structure.

More particularly, referring to FIG. 1, disclosed herein are embodiments of a transistor structure 100, such as a BJT structure or HBT structure. This transistor structure 100 can comprise a semiconductor substrate 101 having a first type conductivity (e.g., P-type). For example, the semiconductor substrate 101 can comprise a P− silicon substrate (i.e., a silicon substrate that is lightly doped with a P-type dopant). For illustration purposes, the substrate 101 is shown as a bulk semiconductor substrate. However, it should be understood that the substrate 101 can, alternatively, comprise a semiconductor layer of a semiconductor-on-insulator wafer.

The transistor structure 100 can further comprise a collector 110 within the substrate 101. This collector region 110 can have a second type conductivity (e.g., N-type) that is different from the first type conductivity. Various different configurations for BJT and HBT collectors are well-known in the art and could be incorporated into the transistor structure 100. For example, the collector 110 can comprise a single N-well region. Alternatively, the collector 110 can comprise multiple N-type collector components, such as the following components described and illustrated in U.S. Patent Publication No. 2008/0265282 of Gluschenkov et al., published on Oct. 30, 2008, assigned to International Business Machines Corporation, and incorporated herein by reference: an N+ buried collector within the substrate; an N− collector above the N+ buried collector and extending to the top surface of the substrate; and an N+ selective implant collector (SIC) pedestal within the N− collector immediately adjacent to the N+ buried collector and separated from the top surface of the substrate by some distance.

Optionally, the transistor structure 100 can further comprise a shallow trench isolation (STI) region positioned within and at the top surface of the semiconductor substrate 101 so as to define the active area of the transistor 100. Specifically, this STI region 102 can, for example, comprise a relatively shallow trench patterned and etched into the top surface of the substrate 101 around (i.e., bordering) an area designated as the active area of the transistor 100. The trench can be filled with one or more isolation materials (e.g., silicon dioxide ($SiO_2$), silicon nitride (SiN), silicon oxynitride (SiON) or any other suitable isolation material or combination thereof).

An intrinsic base 103 can be positioned on the semiconductor substrate 101 over the collector 110 and, optionally, extending laterally over the STI region 102. The intrinsic base 103 can comprise an epitaxial semiconductor layer and, thus, will generally comprise a single crystalline semiconductor material over the substrate 101 and a polycrystalline semiconductor material over the STI regions 102. In the case of a BJT structure, the intrinsic base 103 can comprise, for example, an epitaxial silicon layer. In the case of a HBT structure, the intrinsic base 103 can comprise, for example, an epitaxial silicon germanium layer.

The transistor structure 100 can further comprise an essentially T-shaped emitter 150 above the intrinsic base 103 and a dielectric spacer 111 positioned laterally adjacent to a lower portion 151 of the T-shaped emitter 150. Specifically, the emitter 150 can have a lower portion 151 that is positioned above a first region 103a of the intrinsic base 103 opposite the collector 110 and that is further positioned laterally adjacent to the dielectric spacer 111. The emitter 150 can further have an upper portion 152, which is above and wider than the lower portion 151. The geometry of the wider upper portion 152 can be defined by an etch process (see the detailed discussion regarding the formation of the upper portion 151 of the emitter 150 as set out in the description of the method embodiments below) and can be designed specifically to provide a sufficiently large surface area for receiving an emitter contact 190, given current state of the art lithographic patterning techniques for forming contact openings. The geometry of the narrower lower portion 151 can be essentially defined by the size and shape of an emitter opening as well as the dielectric spacer 111 contained therein (see the detailed discussion regarding the formation of the lower portion 151 of the emitter 150 as set out in the description of the method embodiments below) and can specifically be designed to achieve a given area ratio between the emitter 150 and the intrinsic base 103. In an exemplary embodiment, the lower portion 151 of the emitter 150 surrounded by the dielectric spacer 111 can have a width (i.e., a diameter) ranging anywhere from 60 nm to 300 nm, while the upper portion 152 of the emitter (as measured at the top surface 153) can have a width (i.e., a diameter) ranging anywhere from 200 nm to 600 nm. The emitter 150 can comprise, for example, a polysilicon layer having the same second type conductivity as the collector region (e.g., N-type). The dielectric spacer 111 can comprise a sidewall spacer formed on the sidewall of an emitter opening (see the detailed discussion regarding the formation of the dielectric spacer 111 as set out in the description of the method embodiment below) and can comprise a dielectric material, such as silicon nitride (SiN), silicon oxynitride (SiON) or any other suitable dielectric material.

The transistor structure 100 can further comprise a raised extrinsic base 108. This raised extrinsic base 108 can be above and immediately adjacent to a second region 103b of the intrinsic base 103, thereby creating an extrinsic base to intrinsic base link-up region 106. Thus, the raised extrinsic base 108 is positioned laterally immediately adjacent to the dielectric spacer 111 opposite the lower portion 151 of the emitter 150. The raised extrinsic base 108 can further extend laterally over at least one isolation layer (e.g., a silicon dioxide ($SiO_2$) layer 104-polysilicon layer 105 stack). The stack of isolation layer(s) 104, 105 can be positioned on a third region 103c of the intrinsic base 103 (e.g., above the STI region 102). The raised extrinsic base 108 can comprise an epitaxial semiconductor layer (e.g., an epitaxial silicon layer) and can have the first type conductivity (e.g., P-type). Those skilled in the art will recognize that, due to the epitaxial growth process used to form the extrinsic base, the crystalline structure of the raised extrinsic base 108 may vary. For example, the portion of the extrinsic base 108 at the extrinsic base to intrinsic base linkup region may be single crystalline silicon and the portion of the extrinsic base 108 above the stack of isolation layer(s) 104, 105 may be polycrystalline silicon. Additionally, those skilled in the art will recognize that the concentration of dopant (e.g., P-type dopant) in the extrinsic base 108 will typically be relatively high as compared to the concentration of dopant in the intrinsic base 103.

The transistor structure 100 can further comprise metal silicide layer(s) 120, at least one dielectric layer 130 on the metal silicide layer(s) 120 and a plurality of contacts 190 that extend through the dielectric layer 130 to the metal silicide layer(s) 120. Specifically, a metal silicide layer 120 can cover the top surface 118 of the extrinsic base 108 such that it is positioned laterally immediately adjacent to the dielectric spacer 111 opposite the lower portion 151 of the emitter 150. Thus, this metal silicide layer 120 will be above the extrinsic base 108 at the extrinsic base to intrinsic base link-up region 106. Optionally, a metal silicide layer 120 can also cover the top surface 153 of the upper portion 152 of the emitter 150. These metal silicide layers 120 can each comprise a silicide of, for example, a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof. The dielectric layer(s) 130 can comprise any one or more interlayer dielectrics, such as, silicon dioxide ($SiO_2$), silicon nitride (SiN), borophosphosilicate glass (BPSG), etc. At least a portion of the dielectric layer(s) 130 can be positioned laterally adjacent to the dielectric spacer 111 opposite the lower portion 151 of the emitter 150 and further positioned vertically between the metal silicide layer 120 and the tapered sidewall 154 of the upper portion 152 of the emitter. Contacts 190 can extend vertically through the dielectric layer(s) 130 to the metal silicide layer(s) 120 in order to contact the extrinsic base 108, the emitter 150, etc.

As mentioned above, the upper portion 152 of the emitter 150 can be wider (i.e., can have a greater diameter) than the lower portion 151 (i.e., the emitter 150 can be essentially T-shaped). Thus, in the transistor structure 100 described above, the upper portion 152 of the emitter 150 can extend laterally over the dielectric spacer 111 and further over that section 121 of the metal silicide layer 120, which is immediately adjacent to the dielectric spacer 111 and which is above the extrinsic base to intrinsic base link-up region 106. One exemplary processing technique for ensuring that the metal silicide layer 120 covers the entire extrinsic base 108, including the portion of the extrinsic base 108 below the upper portion 152 of the emitter 150 (i.e., including the portion of the extrinsic base 108 at the extrinsic base to intrinsic base link-up region 106), and for also ensuring that the upper portion 152 of the emitter 150 is sufficiently large enough to receive an emitter contact 190 requires tapering the upper portion 152 of the emitter 150. Such tapering allows a sacrificial dielectric layer on the extrinsic base to be removed during processing, thereby exposing the entire top surface of the extrinsic base and allowing the metal layer required for the silicidation to be deposited thereon.

Figure 2A:
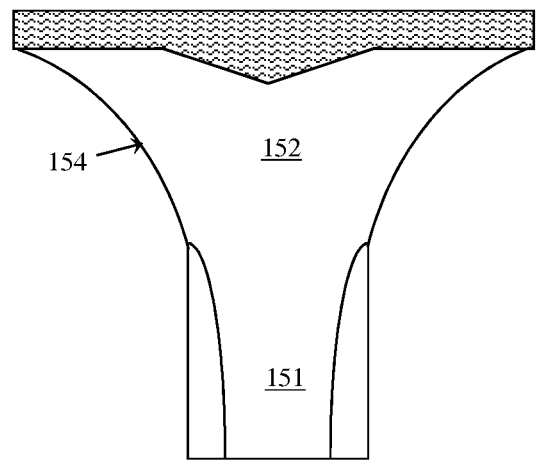
FIG. 2A is a cross-section diagram illustrating an alternative shape for a tapered sidewall in the transistor of FIG. 1.
Figure 2B:
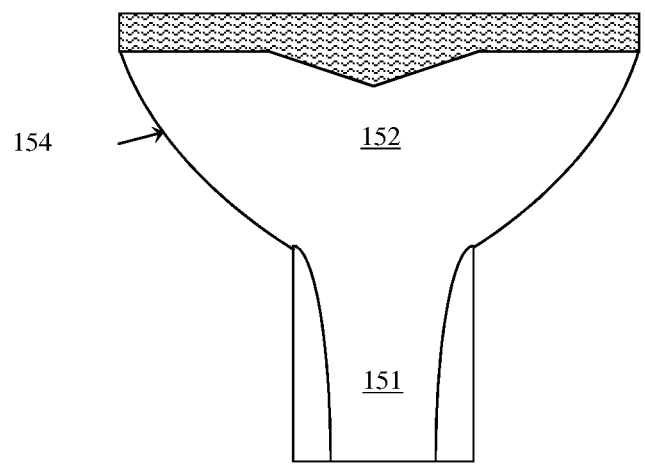
FIG. 2B is a cross-section diagram illustrating another alternative shape for a tapered sidewall in the transistor of FIG. 1.

Therefore, in one embodiment of the transistor structure 100, the upper portion 152 of the emitter 150 has a top surface 153 and a tapered sidewall 154. The tapered sidewall 154 can specifically taper from the top surface 153 toward the dielectric spacer 111 such that the width (i.e., diameter) of the upper portion 152 gradually decreases between the top surface 153 and the interface 156 between the upper portion 152 and the lower portion 151 of the emitter 150. In an exemplary embodiment, the width (i.e., diameter) of the upper portion 152 of the emitter 150 can gradually decrease from approximately 440 nm to approximately 240 nm. To achieve this gradual decrease in width (i.e., in diameter), various different etch process may be used (as discussed in detail below with regard to the method embodiments). Thus, in the resulting structure, the tapered sidewall 154 may be linear (as shown in FIG. 1), curved (as shown in FIGS. 2A and 2B), stepped or may have any other suitable shape. In any case, the taper angle 155 (i.e., the angle between the top surface 153 of the emitter 150 and the sidewall 154) can range between 30 and 75 degrees (e.g., approximately 45 degrees). The shape (i.e., linear, curved, stepped, etc.) of the tapered sidewall 154 and the taper angle 155 can be defined by the etch processes used and can be designed so that, during processing, a sacrificial dielectric layer on the extrinsic base 108 can be completely removed, thereby exposing the all or essentially all of the top surface of the extrinsic base 108, including the portion of the extrinsic base 108 below the upper portion 152 of the emitter 150 (i.e., including the portion of the extrinsic base 108 at the extrinsic base to intrinsic base link-up region 106) and allowing a metal layer required for silicidation to be deposited thereon (see the detailed discussion regarding the tapering etch processes as set out in the description of the method embodiments below).

It should also be understood that in the transistor structure embodiments, described in detail above, any N-type component will comprise (e.g., will be doped with, implanted with, etc.) an N-type dopant and any P-type component will comprise (e.g., will be doped with, implanted with, etc.) a P-type dopant. Such N-type dopants can comprise, for example, Group V dopants, such as arsenic (As), phosphorous (P) or antimony (Sb) and such P-type dopants can comprise, for example, Group III dopants, such as boron (B) or indium (In)).

Figure 3:
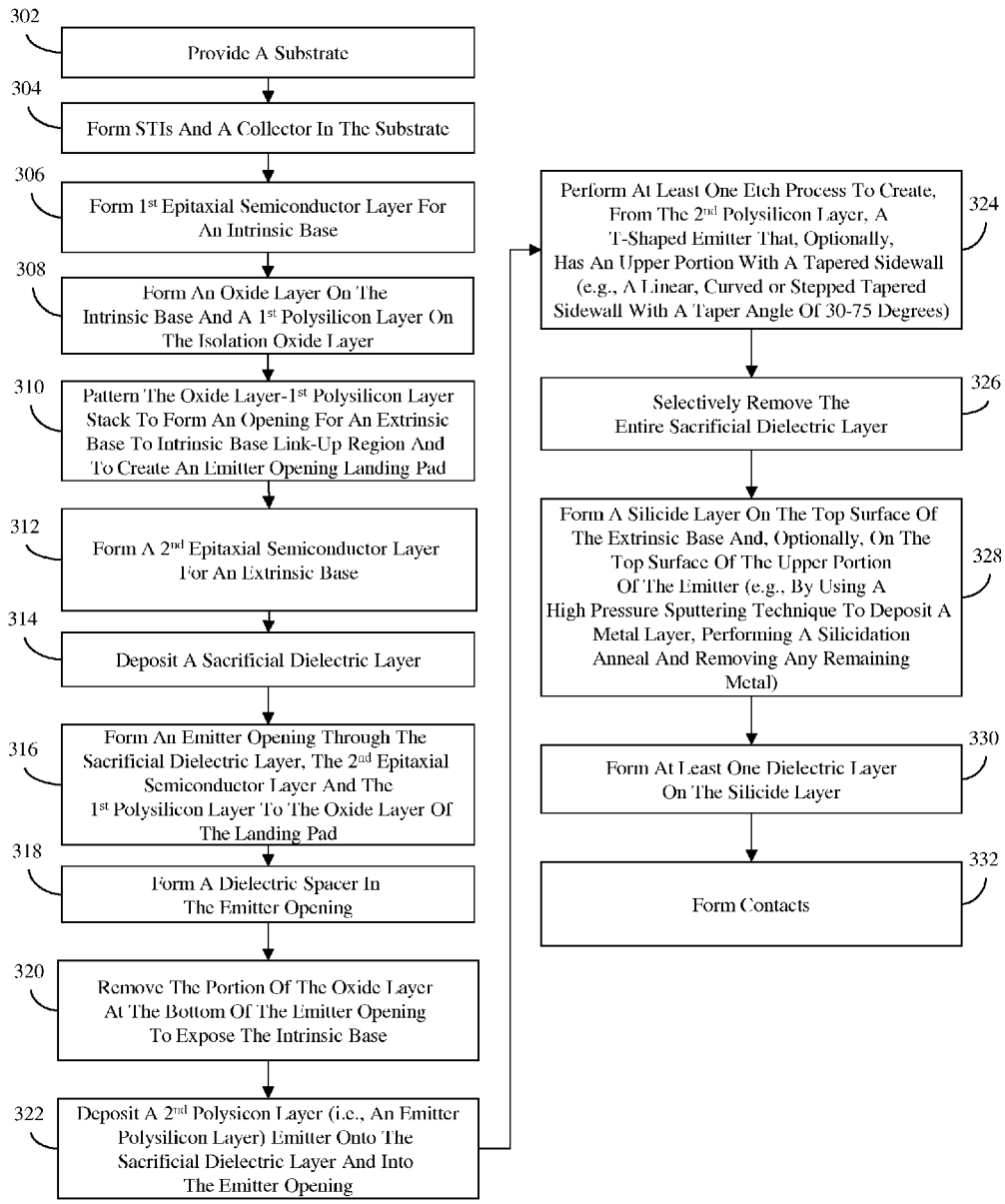
FIG. 3 is a flow diagram illustrating an embodiment of a method of forming a transistor structure.

Referring to FIG. 3, also disclosed herein are embodiments of a method of forming a transistor structure 100 (e.g., a BJT structure or a HBT structure), as described above, and illustrated in FIG. 1. The method can comprise providing a semiconductor substrate 101 having a first type conductivity (e.g., P-type) (302). For example, the semiconductor substrate 101 can comprise a P− silicon substrate (i.e., a silicon substrate lightly doped with a P-type dopant). For illustration purposes, the substrate 101 is shown as a bulk semiconductor substrate. However, it should be understood that the substrate 101 can, alternatively comprise a semiconductor layer of a semiconductor-on-insulator wafer.

Figure 4:
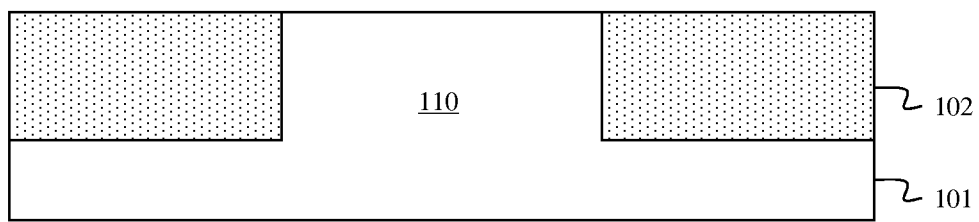
FIG. 4 is a cross-section diagram illustrating a partially completed transistor structure formed according to the method of FIG. 3.

Optionally, a shallow trench isolation (STI) region 102 can be formed within and at the top surface of the semiconductor substrate 101 so as to define the active area of the transistor 100 (304, see FIG. 4). The STI region 102 can be formed using conventional shallow trench isolation (STI) formation techniques. For example, a trench can be lithographically patterned and etched into the semiconductor substrate 101 so as to define the active region. The trench can then be filled with one or more isolation materials (e.g., silicon oxide ($SiO_2$), silicon nitride (SiN), silicon oxynitride (SiON) or any other suitable isolation materials).

Additionally, a collector 110 can be formed within the semiconductor substrate 101 (304, see FIG. 4). This collector 110 can be formed so as to have a second type conductivity (e.g., N-type) that is different from the first type conductivity. Various different techniques for forming BJT and HBT collectors are well-known in the art and can be incorporated into the method embodiments disclosed herein. For example, the collector 110 can be formed as a single N-well region. Alternatively, the collector 110 can be formed as multiple N-type collector components, such as the following components described and illustrated in U.S. Patent Publication No. 2008/0265282 of Gluschenkov et al., published on Oct. 30, 2008, assigned to International Business Machines Corporation, and incorporated herein by reference: an N+ buried collector within the substrate; a N− collector above the N+ buried collector and extending to the top surface of the substrate; and an N+ selective implant collector (SIC) pedestal within the N− collector immediately adjacent to the N+ buried collector and separated from the top surface of the substrate by some distance.

Figure 5:
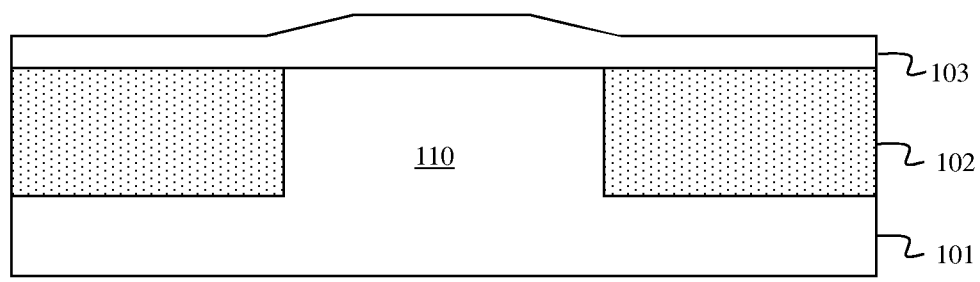
FIG. 5 is a cross-section diagram illustrating a partially completed transistor structure formed according to the method of FIG. 3.

After the STI region 102 and collector 110 are formed, an intrinsic base 103 can be formed on the semiconductor substrate 101 (306, see FIG. 5). Specifically, a first epitaxial semiconductor layer (e.g., an epitaxial silicon layer in the case of a BJT structure or an epitaxial silicon germanium layer in the case of an HBT structure) having a predetermined thickness (e.g., 0.01-0.2 µm) can be formed using a conventional epitaxial growth process (e.g., an ultra high-vacuum/chemical vapor deposition (UHV/CVD) low-temperature epitaxy (LTE) process). As a result, the intrinsic base 103 will generally comprise a single crystalline semiconductor material over the semiconductor substrate 101 and a polycrystalline semiconductor material over the STI region 102. The intrinsic base 103 is preferably in-situ doped with a first type conductivity dopant (e.g., a P-type dopant) such that it has the first type conductivity (e.g., P-type).

Figure 6:
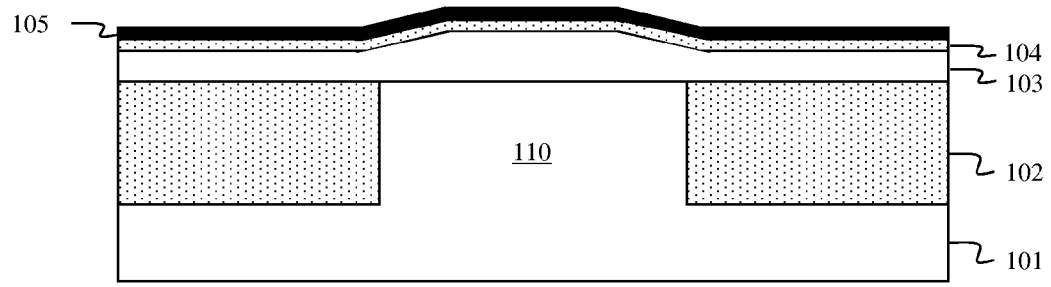
FIG. 6 is a cross-section diagram illustrating a partially completed transistor structure formed according to the method of FIG. 3.
Figure 7:
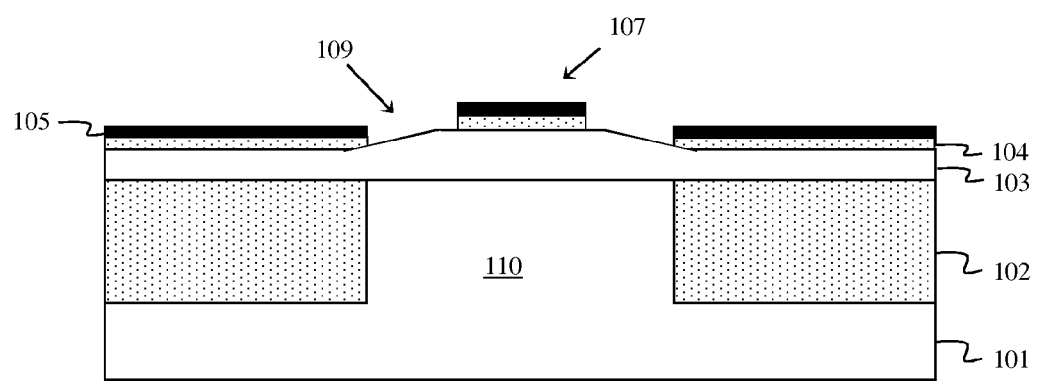
FIG. 7 is a cross-section diagram illustrating a partially completed transistor structure formed according to the method of FIG. 3.

Once the intrinsic base 103 is formed, a silicon dioxide ($SiO_2$) layer 104 that is approximately 5-20 nm thick can be deposited on the intrinsic base 103 and a first polysilicon layer 105 that is approximately 20-100 nm thick can be deposited on the SiO$_2$ layer 104 (308, see FIG. 6). Next, an opening 109 for an extrinsic base to intrinsic base link-up region can be formed in the layers 104, 105, thereby also creating an emitter opening landing pad 107 (310, see FIG. 7). For example, a photoresist layer can be formed on the first polysilicon layer 105 and lithographically patterned for the opening 109. The first polysilicon layer 105 can then be anisotropically etched stopping on the SiO$_2$ layer 104. The photoresist layer can then be removed and chemical oxide removal (COR) process can be performed so as to remove exposed portions of the SiO$_2$ layer 104 within the opening 109 with minimal undercut.

Figure 8:
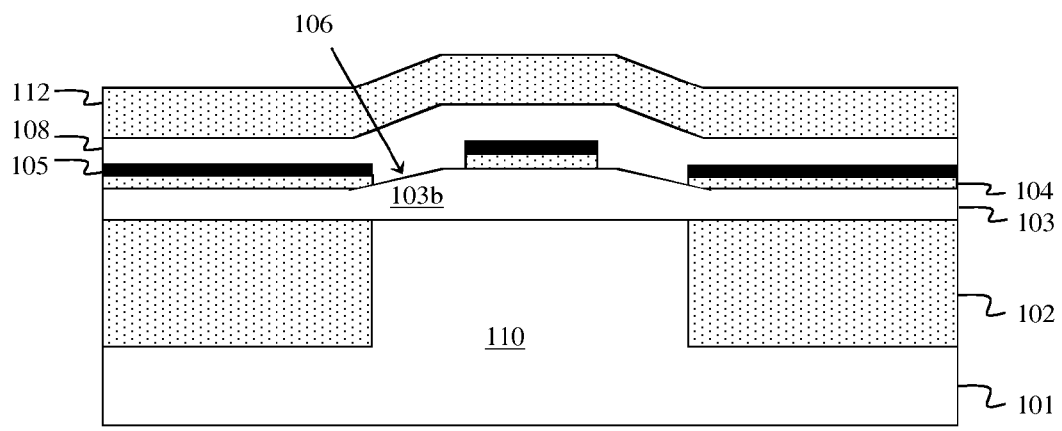
FIG. 8 is a cross-section diagram illustrating a partially completed transistor structure formed according to the method of FIG. 3.

Then, a second epitaxial semiconductor layer for a raised extrinsic base 108 can be formed (e.g., by low-temperature epitaxy (LTE)) on the first polysilicon layer 105 and further on the exposed region 103b of the intrinsic base 103 in the opening 109, thereby creating the extrinsic base to intrinsic base link-up region 106 (312, see FIG. 8). Those skilled in the art will recognize that, due to the epitaxial growth process used at process 312, the crystalline structure of the resulting extrinsic base 108 may vary. For example, the portion of the extrinsic base 108 at the extrinsic base to intrinsic base link-up region 106 may be single crystalline silicon and the portion of the extrinsic base 108 above the polysilicon layer 105 may be polycrystalline silicon. This epitaxial semiconductor layer can be either in situ doped or subsequently implanted with a first type conductivity dopant (e.g., a P-type dopant) so that it has the first type conductivity (e.g., P-type). Typically, the extrinsic base 108 will be doped with a relatively high concentration of the dopant as compared to the intrinsic base 103.

Figure 9:
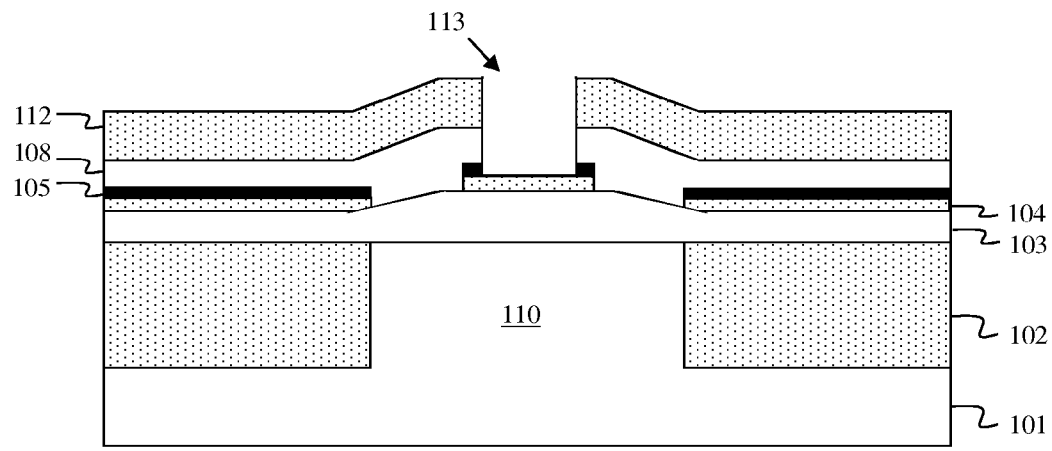
FIG. 9 is a cross-section diagram illustrating a partially completed transistor structure formed according to the method of FIG. 3.

After the second epitaxial semiconductor layer for the raised extrinsic base 108 is formed, a blanket sacrificial dielectric layer 112 with a thickness greater than approximately 50 nm can be deposited onto the second polysilicon layer (314, see FIG. 8). This sacrificial dielectric layer 112 can comprise, for example, silicon dioxide (SiO$_2$) or any other suitable dielectric material that can be selectively etched over the dielectric spacer that will subsequently be formed at process 318, discussed below. Then, an emitter opening 113 can be formed (316, see FIG. 9). Specifically, conventional lithographic patterning and etch techniques can be used to form an opening 113 that extends vertically through the sacrificial dielectric layer 112, through the second epitaxial semiconductor layer (i.e., through the extrinsic base 108), and through the first polysilicon layer 105 to the oxide layer 104 of the emitter opening landing pad 107.

Figure 10:
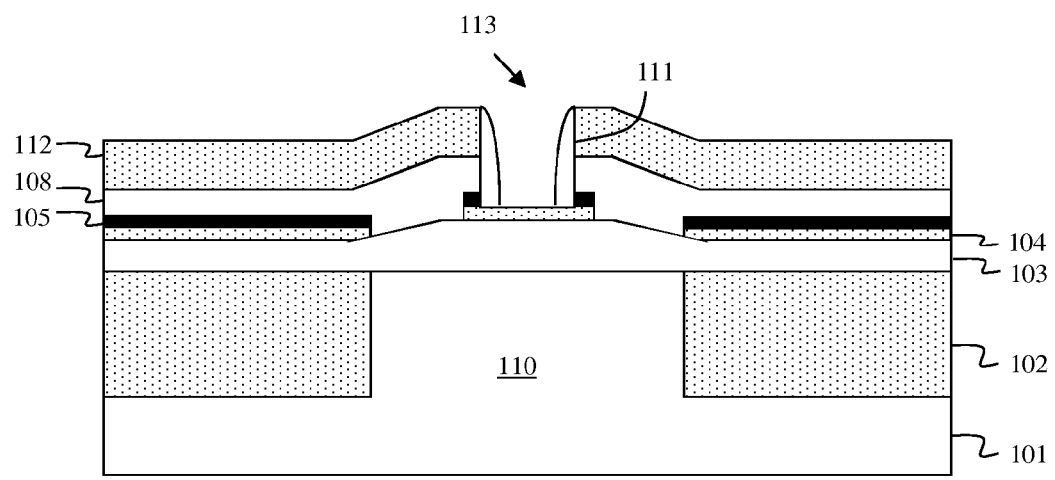
FIG. 10 is a cross-section diagram illustrating a partially completed transistor structure formed according to the method of FIG. 3.
Figure 11:
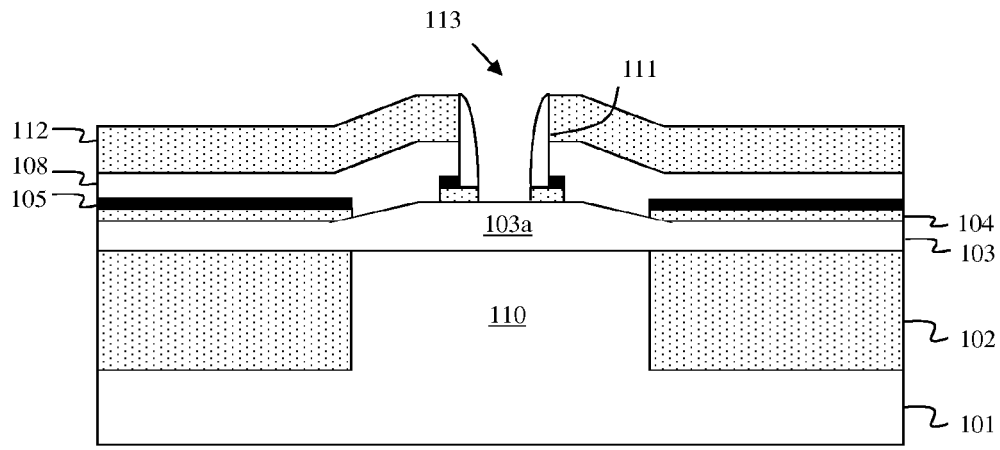
FIG. 11 is a cross-section diagram illustrating a partially completed transistor structure formed according to the method of FIG. 3.

Once the emitter opening 113 is formed, a dielectric spacer 111 can be formed on the sidewall of the opening 113 such that it is positioned laterally immediately adjacent to vertical surfaces of the sacrificial dielectric layer 112 and the extrinsic base 108 (318, see FIG. 10). The dielectric spacer 111 can be formed using conventional sidewall spacer formation techniques. For example, a conformal layer of dielectric material (e.g., silicon nitride (SiN) or any other material that will remain essentially intact during subsequent removal of the sacrificial dielectric layer 112 at process 328, discussed below) can be deposited and then anisotropically etched so as to remove it from any horizontal surfaces. Next, the portion of the oxide layer 104 exposed at the bottom of the emitter opening 113 can be removed (e.g., by a chemical oxide removal (COR) process), thereby exposing a first region 103a of the intrinsic base 103 (320, see FIG. 11).

Figure 12:
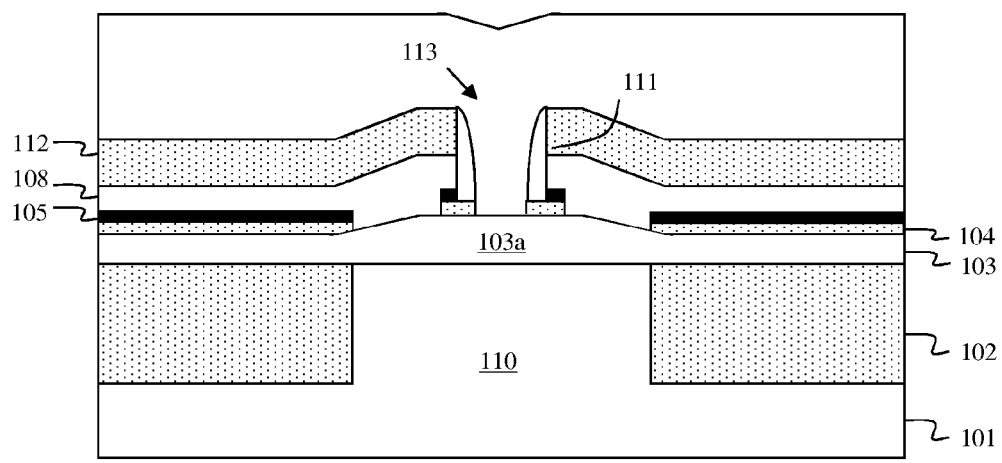
FIG. 12 is a cross-section diagram illustrating a partially completed transistor structure formed according to the method of FIG. 3.
Figure 13:
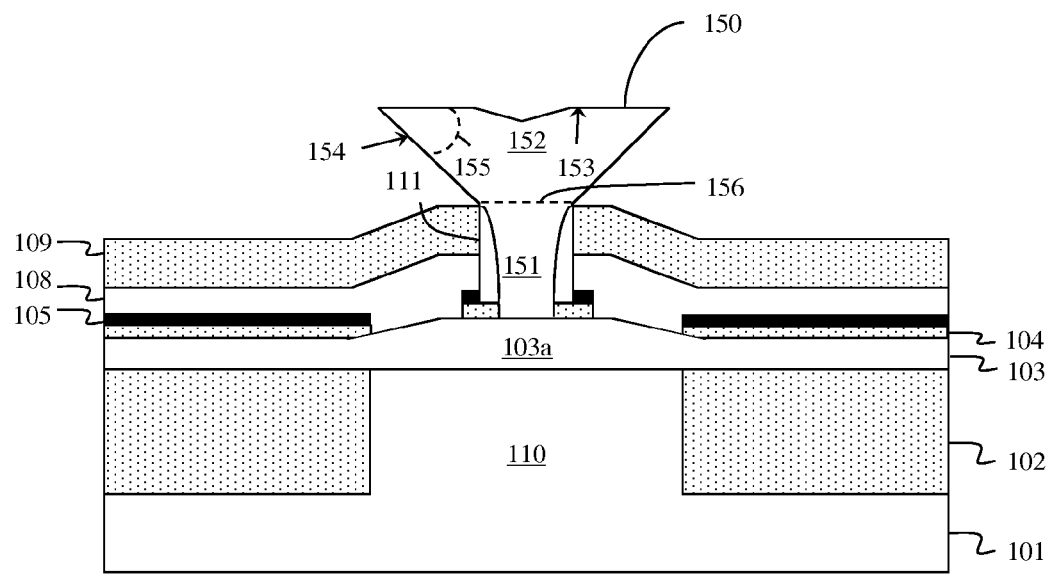
FIG. 13 is a cross-section diagram illustrating a partially completed transistor structure formed according to the method of FIG. 3.

Then, a second polysilicon layer 140 for the emitter 150 can be deposited on top of the sacrificial dielectric layer 112 so as to fill the emitter opening 113 (322, see FIG. 12). This second polysilicon layer can be either in-situ doped or subsequently implanted with a second type conductivity dopant (e.g., an N-type dopant) such that it has the same conductivity type as the collector 110. Next, at least one etch process can be performed so as to create, from the second polysilicon layer, an essentially T-shaped emitter 150 that comprises a lower portion 151 and an upper portion 152 above the lower portion 151 (324, see FIG. 13). Specifically, a mask that is wider than the emitter opening 113 can be formed on the second polysilicon layer aligned above the emitter opening 113. The lower portion 151 of the emitter 150 can be that portion of the second polysilicon layer within the emitter opening 113 on the first region 103a of the intrinsic base 103 opposite the collector 110 and further positioned laterally adjacent to the dielectric spacer 111. Thus, the geometry of the lower portion 151 can be essentially defined by the size and shape of an emitter opening 113 as well as the dielectric spacer 111 contained therein and can specifically be designed to achieve a given area ratio between the emitter 150 and the intrinsic base 103. In an exemplary embodiment, the lower portion 151 of the can have a width (i.e., a diameter) ranging anywhere from 60 nm to 300 nm. Using the mask, one or more etch process(es) can be performed so as to define the size and shape of the upper portion 152 of the emitter 150 so that the upper portion 152 is wider than the lower portion 151 and so that it extends laterally over the dielectric spacer 111 onto the sacrificial dielectric layer 112. The wider upper portion 152 is designed to provide a sufficiently large surface area for subsequently receiving an emitter contact 190 at process 332, discussed below, given current state of the art lithographic patterning techniques for forming contact openings. In one exemplary embodiment, the etch process(es) can be performed so that the upper portion 152 of the emitter (as measured at the top surface 153) has a diameter ranging anywhere from 200 nm to 600 nm.

Figure 14:
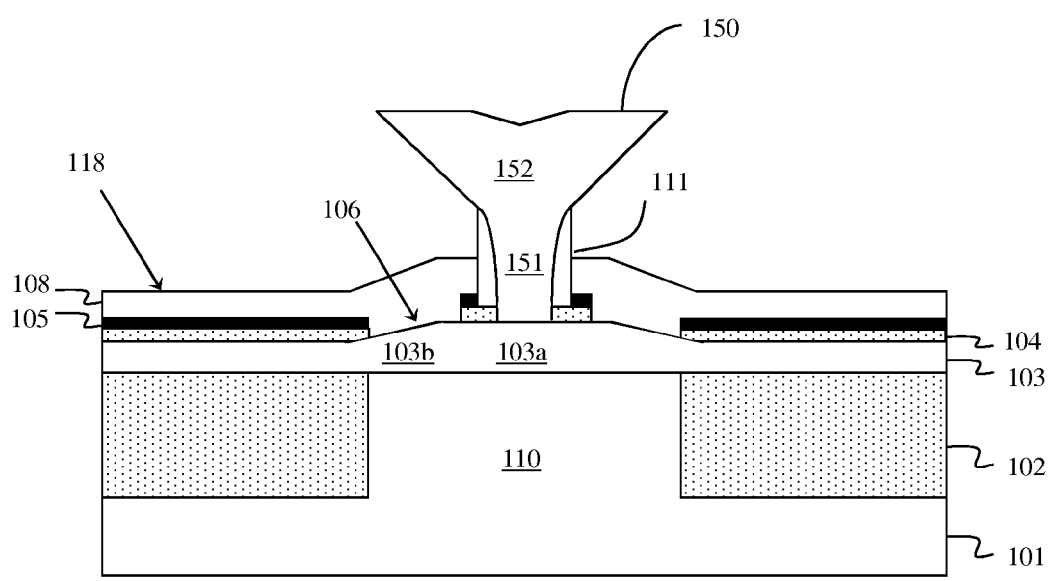
FIG. 14 is a cross-section diagram illustrating a partially completed transistor structure formed according to the method of FIG. 3.

Next, the method can comprise selectively removing the sacrificial dielectric layer 112 (326, see FIG. 14). The sacrificial dielectric layer 112 is removed at process 326 so as to expose essentially the entire top surface 118 of the extrinsic base 108, including the portion of the extrinsic base 108 that is below the upper portion 152 of the emitter 150 at the extrinsic base to intrinsic base link-up region 106 (i.e., including the portion of the extrinsic base 108 immediately adjacent to the second region 103b of the intrinsic base 103). The sacrificial dielectric layer 112 can be removed, for example, using a selective isotropic wet chemical etch (e.g., diluted HF or buffered HF) so as to ensure that the extrinsic base 108 and dielectric spacer 111 remain intact.

Figure 15:
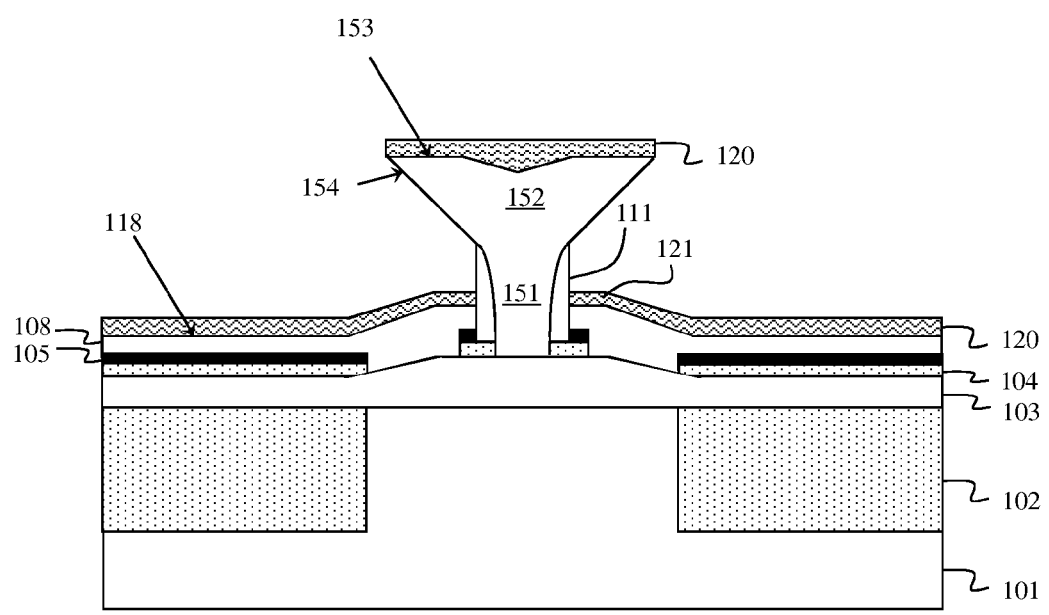
FIG. 15 is a cross-section diagram illustrating a partially completed transistor structure formed according to the method of FIG. 3.

After the sacrificial dielectric layer 112 is removed, a metal silicide layer 120 can be formed on the top surface 118 of the extrinsic base 108 such that the metal silicide layer 120 is positioned laterally immediately adjacent to the dielectric spacer 111 opposite the lower portion 151 of the emitter 150 (i.e., at the extrinsic base to intrinsic base link-up region 106) and, thus, such that a section 121 of the metal silicide layer 120 is below the upper portion 152 of the emitter 150 (328, see FIG. 15). Optionally, a metal silicide layer 120 can also essentially simultaneously be formed on the top surface 153 of the upper portion of the emitter 150. Forming the metal silicide layer 120 can comprise depositing a metal layer on the extrinsic base. This metal layer can, for example, comprise a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof. In one embodiment, the metal layer can be deposited using a high pressure sputtering technique in order to ensure that the metal layer is deposited below the upper portion of the emitter. For example, the metal layer can be sputtered onto the top surface 118 of the extrinsic base 108 under the following conditions:

pressure of at least 0.5 mTorr (e.g., 0.5-50 mTorr or more, and, preferably, at approximately 20 mTorr), power at 0.02-3 kW, radio frequency (RF) bias on the wafer of 0-1 kW (and, preferably, at a RF bias of at least 5 Watts) and temperature at 15-300° C. After the metal layer is deposited, a silicidation anneal (e.g., a thermal anneal) can be performed in order to cause metal atoms from the metal layer to react with the silicon material below and, thereby create the metal silicide layers 120 at the metal-silicon interfaces. Finally, any excess unreacted metal can be selectively removed.

One exemplary processing technique for ensuring that a metal silicide layer 120 covers the entire top surface 118 of the extrinsic base 108, including the portion of the extrinsic base immediately adjacent to the dielectric spacer 111 (i.e., including the portion of the extrinsic base at the extrinsic base to intrinsic base link-up region 106) and for also ensuring that the upper portion 152 of the emitter 150 is sufficiently large enough to receive an emitter contact requires tapering the upper portion of the emitter. That is, during the etch process(es) 324 discussed above, the second polysilicon layer can further be etched such that the upper portion 152 of the emitter 150 has a tapered sidewall 154 (see FIG. 13). Specifically, the etch process(es) 324 can be performed so that that the resulting sidewall 154 is tapered from the top surface 153 of the upper portion 152 of the emitter 150 toward the dielectric spacer 111 and, thereby such that the width (i.e., diameter) of the upper portion 152 of the emitter 150 gradually decreases between the top surface 153 and the interface 156 between the upper portion 152 and the lower portion 151 of the emitter 150. In an exemplary embodiment, the etch process(es) 324 can be performed such that the width (i.e., the diameter) of the upper portion 152 of the emitter 150 gradually decreases from approximately 440 nm to approximately 240 nm.

Depending upon the etch process(es) 324 used, the shape of the tapered sidewall 154 may vary. For example, a tapered sidewall 154 that is linear (as shown in FIG. 1) may be achieved by using SF6 etch under controlled constant pressure conditions. In this case, the angle of etch is dependent on incoming etch film thickness. As etch film thickness decreases, the range of achievable angles diminishes. Alternatively, a tapered sidewall that is curved (as shown in FIGS. 2A and 2B) may be achieved by achieved through dynamic control of etch pressure settings. Gradual increase or decrease of pressure determines curvature of etch profile. It should be understood that the varying shapes of the tapered sidewall 154, as shown FIGS. 1, 2A and 2B are not intended to be limiting. Other etch process(es) that result in other shapes (e.g. stepped, etc.) could alternatively be used. In any case, the etch process(es) 324 should be performed so that the taper angle 155 (i.e., the angle between the top surface 153 of the emitter 150 and the sidewall 154) ranges between 30 and 75 degrees (e.g., is approximately 45 degrees) and specifically so that, at process 326, the sacrificial dielectric layer 112 on the extrinsic base 108 can be easily and essentially completely removed and so that, as process 328, there is less obstructed access, for metal layer deposition, to the exposed portion of the extrinsic base 108 below the upper portion 152 of the emitter 150.

Following silicide layer formation, additional process steps can be performed in order to complete the transistor structure 100 (330-332, see FIG. 1). For example, one or more dielectric layer(s) 130 can be formed (e.g., deposited using conventional techniques) onto the metal silicide layer(s) 120. Specifically, the dielectric layer(s) 130 can be deposited such that at least a portion of a dielectric layer is positioned laterally adjacent to the dielectric spacer 111 opposite the lower portion 151 of the emitter 150 and further positioned vertically between the metal silicide layer 120 and the tapered sidewall 154 of the upper portion 152 of the emitter 150. The dielectric layer(s) 130 can comprise any one or more interlayer dielectrics, such as, silicon dioxide ($SiO_2$), silicon nitride (SiN), borophosphosilicate glass (BPSG), etc. Additionally, conventional processing techniques can be used to form contacts 190 that extend vertically through the dielectric layer(s) 130 to the metal silicide layer(s) 120 in order to contact the extrinsic base 108, the emitter 150, etc.

The method embodiments as described can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed embodiments and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The details set for above have been presented for purposes of illustration and description and are not intended to be exhaustive or limiting. Many modifications and variations to the disclosed embodiments will be apparent to those of ordinary skill in the art without departing from the scope and spirit thereof. The details were provided in order to best explain the principles and practical application of the embodiments and to enable others of ordinary skill in the art to understand the embodiments with various modifications as are suited to the particular use contemplated.

Therefore, disclosed above are embodiments of a transistor structure, such as a bipolar junction transistor (BJT) structure or a heterojunction bipolar transistor (HBT) structure, having an extrinsic base with a top surface that is completely silicided for reduced base resistance $R_b$. Specifically, the transistor structure can incorporate a metal silicide layer that covers the top surface of the extrinsic base, including the portion of the extrinsic base that extends below the upper portion of a T-shaped emitter (i.e., including the portion of the extrinsic base that is at the extrinsic base to intrinsic base link-up region). One exemplary technique for ensuring that the metal silicide layer covers this portion of the extrinsic base requires tapering the upper portion of the emitter. Such tapering allows a sacrificial dielectric layer below the upper portion of the emitter to be completely removed during processing, thereby exposing the portion of the extrinsic base below and allowing the metal layer required for silicidation to be deposited thereon. In one embodiment, this metal layer can be deposited using a high pressure sputtering technique to ensure that all exposed surfaces of the extrinsic base, even those below the upper portion of the emitter, are covered.

What is claimed is:

1. A method of forming a transistor, said method comprising:
    performing at least one etch process so as to create, from a polysilicon layer, an emitter comprising: a lower portion and an upper portion above said lower portion,
        said lower portion being on an intrinsic base and positioned laterally adjacent to a dielectric spacer, and
        said upper portion being wider than said lower portion, extending laterally over said dielectric spacer onto a sacrificial layer and having a tapered sidewall;
    selectively removing said sacrificial layer so as to expose an extrinsic base positioned laterally adjacent to said dielectric spacer opposite said lower portion of said emitter, said upper portion of said emitter extending laterally over said extrinsic base; and,
    forming a silicide layer on said extrinsic base such that said silicide layer is positioned laterally immediately adjacent to said dielectric spacer opposite said lower portion of said emitter
    and such that said upper portion of said emitter extends laterally over said silicide layer;
    forming a dielectric layer on said silicide layer such that said dielectric layer is positioned laterally immediately adjacent to said dielectric spacer opposite said lower portion of said emitter and further positioned vertically between and immediately adjacent to said silicide layer and said tapered sidewall of said upper portion of said emitter.

2. The method of claim 1, said forming of said silicide layer comprising:
    sputtering a metal layer onto said extrinsic base in order to ensure that said metal layer is deposited below said upper portion of said emitter, said sputtering being performed at a pressure of at least 20 mTorr and with a radio frequency (RF) bias of at least 5 Watts; and
    performing a silicidation anneal.

3. The method of claim 1, further comprising forming said intrinsic base, said forming of said intrinsic base comprising epitaxially growing, on a silicon substrate, any one of silicon layer and a silicon germanium layer.

4. The method of claim 1, said sacrificial layer comprising a sacrificial dielectric layer comprising a different dielectric material than said dielectric spacer.

5. A method of forming a transistor, said method comprising:
    forming an epitaxial semiconductor layer for an extrinsic base;
    forming a sacrificial dielectric layer on said epitaxial semiconductor layer;
    forming an emitter opening that extends vertically through said sacrificial dielectric layer and said extrinsic base to an emitter opening landing pad;
    forming a dielectric spacer on a sidewall of said emitter opening such that said dielectric spacer is positioned laterally adjacent to vertical surfaces of said extrinsic base and said sacrificial dielectric layer;
    after said forming of said dielectric spacer, selectively removing a portion of said emitter opening landing pad exposed in said emitter opening in order to expose a center region of an intrinsic base;
    depositing a polysilicon layer on said sacrificial dielectric layer and in said emitter opening on said center region of said intrinsic base;
    performing at least one etch process so as to create, from said polysilicon layer, an emitter comprising: a lower portion, an upper portion above said lower portion and a top surface,
        said lower portion being on said center region of said intrinsic base and positioned laterally adjacent to said dielectric spacer,
        said upper portion being wider than said lower portion, extending laterally over said dielectric spacer onto a section of said sacrificial dielectric layer, and having a tapered sidewall so that said section of said sacrificial dielectric layer is exposed and so that a width of said upper portion of said emitter decreases between said top surface and an interface between said upper portion of said emitter and said lower portion of said emitter;
    selectively removing said sacrificial dielectric layer such that said section of said sacrificial dielectric layer below said upper portion of said emitter is removed and such that said extrinsic base is exposed; and,
    forming a silicide layer on said extrinsic base such that said silicide layer is positioned laterally immediately adjacent to said dielectric spacer opposite said lower portion of said emitter and such that said upper portion of said emitter extends laterally over said silicide layer.

6. The method of claim 5, said at least one etch process being performed such that said tapered sidewall is linear from said top surface of said emitter to a top of said dielectric spacer at said interface between said lower portion of said emitter and said upper portion of said emitter.

7. The method of claim 5, said at least one etch process being performed such that said tapered sidewall is curved upward from said top surface of said emitter to a top of said dielectric spacer at said interface between said lower portion of said emitter and said upper portion of said emitter.

8. The method of claim 5, said at least one etch process being performed such that said tapered sidewall is curved downward from said top surface of said emitter to a top of said dielectric spacer at said interface between said lower portion of said emitter and said upper portion of said emitter.

9. The method of claim 5, said forming of said silicide layer comprising: sputtering a metal layer onto said extrinsic base in order to ensure that said metal layer is deposited below said upper portion of said emitter; and performing a silicidation anneal.

10. The method of claim 9, said sputtering being performed at a pressure of at least 20 mTorr and with a radio frequency (RF) bias of at least 5 Watts.

11. The method of claim 5, further comprising forming an additional dielectric layer on said silicide layer such that said additional dielectric layer is positioned laterally immediately adjacent to said dielectric spacer opposite said lower portion of said emitter and further positioned vertically between and immediately adjacent to both said silicide layer and said tapered sidewall of said upper portion of said emitter.

12. The method of claim 5, further comprising, before said forming of said epitaxial semiconductor layer for said extrinsic base, forming said intrinsic base, said forming of said intrinsic base comprising epitaxially growing, on a silicon substrate, any one of silicon layer and a silicon germanium layer.

13. The method of claim 5, said sacrificial dielectric layer comprising a different dielectric material than said dielectric spacer.

14. A method of forming a bipolar transistor, said method comprising:
- performing at least one etch process so as to create, from a polysilicon layer, an emitter comprising: a lower portion, an upper portion above said lower portion and a top surface,
  - said lower portion being on an intrinsic base and positioned laterally adjacent to a dielectric spacer, and
  - said upper portion being wider than said lower portion, extending laterally over said dielectric spacer onto a section of said sacrificial layer, and having a linearly tapered sidewall so that said section of said sacrificial dielectric layer is exposed and so that a width of said upper portion decreases between said top surface of said emitter and an interface between said upper portion of said emitter and said lower portion of said emitter;
- selectively removing said sacrificial layer so as to expose an extrinsic base positioned laterally adjacent to said dielectric spacer opposite said lower portion of said emitter, said upper portion of said emitter extending laterally over said extrinsic base; and
- forming a silicide layer on said extrinsic base such that said silicide layer is positioned laterally immediately adjacent to said dielectric spacer opposite said lower portion of said emitter and such that said upper portion of said emitter extends laterally over said silicide layer;
- forming an additional dielectric layer on said silicide layer such that said additional dielectric layer is positioned immediately laterally adjacent to said dielectric spacer opposite said lower portion of said emitter and further positioned vertically between and immediately adjacent to said silicide layer and said tapered sidewall of said upper portion of said emitter.

15. The method of claim 14, said forming of said silicide layer comprising:
- sputtering a metal layer onto said extrinsic base in order to ensure that said metal layer is deposited below said upper portion of said emitter, said sputtering being performed at a pressure of at least 20 mTorr and with a radio frequency (RF) bias of at least 5 Watts; and
- performing a silicidation anneal.

16. The method of claim 14, said performing of said at least one etch process comprising performing said at least one etch process such that said tapered sidewall has a taper angle ranging between 30 and 75 degrees.

17. The method of claim 14, said performing of said at least one etch process comprising performing said at least one etch process such that said tapered sidewall has a taper angle of approximately 45 degrees.

18. The method of claim 14, said sacrificial layer comprising a sacrificial dielectric layer comprising a different dielectric material than said dielectric spacer.

* * * * *